US012615369B2

(12) United States Patent (10) Patent No.: US 12,615,369 B2
Owen (45) Date of Patent: Apr. 28, 2026

(54) SYSTEMS AND METHODS FOR IMPROVED ENTROPY CODING EFFICIENCY

(71) Applicant: DOLBY LABORATORIES LICENSING CORPORATION

(72) Inventor: Andrew Owen, Normanhurst (AU)

(73) Assignee: DOLBY LABORATORIES LICENSING CORPORATION

( * ) Notice: Subject to any disclaimer, the term of this patent is extended or adjusted under 35 U.S.C. 154(b) by 11 days.

(21) Appl. No.: 18/835,325

(22) PCT Filed: Feb. 2, 2023

(86) PCT No.: PCT/US2023/061840
§ 371 (c)(1),
(2) Date: Aug. 1, 2024

(87) PCT Pub. No.: WO2023/150611
PCT Pub. Date: Aug. 10, 2023

(65) Prior Publication Data
US 2025/0142074 A1 May 1, 2025

Related U.S. Application Data

(60) Provisional application No. 63/306,312, filed on Feb. 3, 2022.

(30) Foreign Application Priority Data

Mar. 2, 2022 (EP) ..................................... 22159715

(51) Int. Cl.
*H04N 19/13* (2014.01)
*H03M 7/40* (2006.01)
(52) U.S. Cl.
CPC .......... *H04N 19/13* (2014.11); *H03M 7/4043* (2013.01)

(58) Field of Classification Search
CPC ............................ H03M 7/4043; H04N 19/13
(Continued)

(56) References Cited

U.S. PATENT DOCUMENTS 7,599,840 B2 10/2009 Mehrotra
8,184,712 B2 5/2012 Mukherjee
(Continued)

OTHER PUBLICATIONS

S. M. Najmabadi, Z. Wang, Y. Baroud and S. Simon, "High throughput hardware architectures for asymmetric numeral systems entropy coding," 2015 9th International Symposium on Image and Signal Processing and Analysis (ISPA), Zagreb, Croatia, 2015, pp. 256-259, doi: 10.1109/ISPA.2015.730 (Year: 2015).*
(Continued)

*Primary Examiner* — Christopher S Kelley
*Assistant Examiner* — Ana Picon-Feliciano

(57) ABSTRACT

Systems and methods for an entropy coding system are described. The entropy coding systems include an encoding apparatus and a decoding apparatus. The encoding apparatus is configured to receive an original input stream comprising a plurality of symbols having a known entropy characteristic according to a probability distribution of each of the symbols appearing in the original input stream, determine an input and respective state for each symbol read from the original input stream, append the determined input to the encoded output stream, and provided the encoded output stream to the decoding apparatus. The decoding apparatus is configured to receive the encoded output stream, process the encoded output stream, and for each read input: determine an output symbol and a respective output, persist the respective output state to the encoded output stream, and append the determined output symbol to the results output stream.

18 Claims, 11 Drawing Sheets

(58) Field of Classification Search
USPC ................................................... 375/240.12
See application file for complete search history.

(56) References Cited

U.S. PATENT DOCUMENTS

| | | | |
|---|---|---|---|
| 8,718,146 | B2 | 5/2014 | Kim |
| 8,907,823 | B2 | 12/2014 | Marpe |
| 8,947,271 | B2 | 2/2015 | Lynch |
| 8,947,273 | B2 | 2/2015 | Bartnik |
| 9,130,585 | B2 | 9/2015 | Marpe |
| 10,547,847 | B2 | 1/2020 | Jang |
| 10,582,215 | B2 | 3/2020 | Jang |
| 11,115,050 | B1 * | 9/2021 | Chang ................. H03M 7/6017 |
| 2012/0014429 | A1 | 1/2012 | Zhao |
| 2012/0014457 | A1 | 1/2012 | He |
| 2013/0027230 | A1 | 1/2013 | Marpe |
| 2014/0140400 | A1 | 5/2014 | George |
| 2014/0210652 | A1 | 7/2014 | Bartnik |
| 2018/0205953 | A1 | 7/2018 | George |
| 2018/0309987 | A1 | 10/2018 | Kim |
| 2019/0394467 | A1 | 12/2019 | He |

OTHER PUBLICATIONS

A. K. Khandani. A hierarchical dynamic programming approach to fixed-rate, entropy-coded quantization. in IEEE Transactions on Information Theory, vol. 42, No. 4, pp. 1298-1303, Jul. 1996. doi: 10.1109/18.508863. 6 pages.

Anonymous: Tunstall Coding Feb. 21, 2020, pp. 1-4, XP055954653, 4 pages.

Jarek Duda. "Asymmetric numeral systems: entropy coding combining speed of Huffman coding wit compression rate of arithmetic coding". Jan. 6, 2012, XP055714447. 24 pages.

Najmabadi Seyyed Mahdi et al; High throughout hardware architectures for asymmetric numeral systems entropy coding; 2015 9th International Symposium on Image and Signal Processing a Analysis (ISPA), IEEE, Sep. 7, 2015 (Sep. 7, 2015), pp. 256-259, XP032798428. 4 pages.

Richardson Iain EG: "264/MPEG-4 Part 10: Variable Length Coding H.264/MPEG-4 Part 10 White Paper Variable-Length Coding" Oct. 17, 2022, pp. 1-7, XP055953979. 7 pages.

* cited by examiner

310

Start

Receive Input Stream

312

Reverse Order of Symbols

314

Determine Input and State Mappings for Next Symbol

316

Select Input Based on the Respective State and Contents of Output

318

Remove Bits Corresponding to the Selected State

320

Append Selected Input to Output Stream

322

More Symbols?
324

Yes

No

End

502

Input ccd 1. dcc
2. d → 011
3. c → 010,(0) 011 or
         111,(1) 011
4. 010 (0)11 → 01011
5. c → 010,(0) 01011 or
         111,(1) 01011
6. 010 (0)1011 → 0101011

Output: 0101011

504

Input 0101011

1. (010)1011
2. (c,0)1011 → c 01011
3. c (010)11
4. c (c,0)11 → cc 011
5. cc (011)
6. cc (d)
7. ccd Output: ccd

| Input | Symbol | State |
|-------|--------|-------|
| 000   | a      | 0     |
| 001   | b      | 0     |
| 010   | c      | 0     |
| 011   | d      |       |
| 100   | e      |       |
| 101   | a      | 1     |
| 110   | b      | 1     |
| 111   | c      | 1     |

| Input | Symbol | State |
|-------|--------|-------|
| 000 | a | 010 |
| 001 | a | 10 |
| 010 | a | 11 |
| 011 | a | 00 |
| 100 | a | 011 |
| 101 | b | 0 |
| 110 | b | 1 |
| 111 | c | |

512

Input: aabc 1. cbaa
2. c → 111
3. b → 101,(0) 111 or
   110,(1) 111
4. 110 (1)11 → 11011
5. a → 000,(010) 11011,
   001,(10) 11011,
   010,(11) 11011,
   011,(00) 11011, or
   100,(011) 11011
6. 010 (11)011 → 010011
7. a → 000,(010) 010011,
   001,(10) 010011,
   010,(11) 010011,
   011,(00) 010011, or
   100,(011) 010011
8. 000 (010)011 → 000011

Output: 000011

514

Input: 000011

1. (000)011
2. (a,010)011 → a 010011
3. a (010)011
4. a (a,11)011 → aa 11011
5. aa (110)11
6. aa (b,1)11 → aab 111
7. aab (111)
8. aab (c)
9. aabc Output: aabc

FIG. 5B

| Input | Symbol | Last k Bits | State |
|-------|--------|-------------|-------|
| 000 | a | 00 | 010 |
| 001 | a | 01 | 10 |
| 010 | a | 10 | 11 |
| 011 | a | 11 | 00 |
| 100 | a | 00 | 001 |
| 101 | b | 1 | 0 |
| 110 | b | 0 | 1 |
| 111 | c | | |

| Input | Symbol | Last k Bits | Bonus | State |
|-------|--------|-------------|-------|-------|
| 000 | a | 00 | 0 | 010 |
| 001 | a | 01 | | 10 |
| 010 | a | 10 | | 11 |
| 011 | a | 11 | | 00 |
| 100 | a | 00 | 1 | 011 |
| 101 | b | 1 | | 0 |
| 110 | b | 0 | | 1 |
| 111 | c | | | |

| Input | Symbol | Last k Bits | Last k Bits +1 | Bonus | State |
|-------|--------|-------------|----------------|-------|-------|
| 000 | a | 00 | 01 | 0 | 010 |
| 001 | a | 01 | 10 | | 10 |
| 010 | a | 10 | 11 | | 11 |
| 011 | a | 11 | 00 | | 00 |
| 100 | a | 00 | 01 | 1 | 011 |
| 101 | b | 1 | 0 | | 0 |
| 110 | b | 0 | 1 | | 1 |
| 111 | c | | | | |

SYSTEMS AND METHODS FOR IMPROVED ENTROPY CODING EFFICIENCY

CROSS-REFERENCE TO RELATED APPLICATIONS

This application is a U.S. National Stage application under U.S.C. 371 of International Application No. PCT/US2023/061840, filed on Feb. 2, 2023, which claims priority to European Patent Application No. 22159715.6, filed Mar. 2, 2022, and U.S. provisional application 63/306,312, filed Feb. 3, 2022, all of which are incorporated herein by reference in their entirety.

FIELD

This application relates generally to systems and methods that employ entropy encoding in the encoding and decoding of data streams.

BACKGROUND

In computing, the concept of entropy can include the expected number of bits of information contained in each message (e.g., a data stream that contains a stream of symbols), taken over all possibilities for the transmitted message or, to state it another way, how much useful information a message is expected to contain. Entropy provides a lower bound for the size of an encoding scheme, in the sense that the expected number of bits to be transmitted under some encoding scheme is at least the entropy of the data stream.

Entropy coding can include a type of data compression scheme employed to compress digital data (e.g., a bitstream) independent of the specific characteristics of the medium. In entropy coding, frequently occurring symbols or patterns are typically represented with a smaller number of bits than rarely occurring symbols or patterns.

Some techniques of entropy coding create and assign a unique code to each unique symbol that occurs in the data stream. In such examples, data can be compressed by replacing each fixed-length input symbol by a corresponding variable-length prefix codeword where the length of each codeword is approximately proportional to the negative logarithm of the probability. Therefore, in such examples, the most common symbols use the shortest codes. In other examples, an entire message may be encoded as a single unit. Huffman coding, which involves determining and employing a particular type of optimal prefix code (see above) and arithmetic coding, which involves storing frequently occurring characters with fewer bits and not-so-frequently occurring characters will be stored with more bits, resulting in fewer bits used in total, are two commonly used entropy encoding techniques.

SUMMARY OF THE DESCRIPTION

When the approximate entropy characteristic of a data stream is known in advance, a disambiguate or state associated with static code can be employed for more optimal compression results. Accordingly, various aspects of the present disclosure relate to circuits, systems, and methods for encoding and decoding information by employing an improved entropy coding system. The described system is employed to encode and decode input streams using a mapping of the symbols appearing the input streams. The mapping is determined for symbols based on a known entropy characteristic of the symbols according to a probability distribution of each of the symbols appearing. In some embodiments, the mapping maps each of the symbols to at least one unique input, state pair, which are employed in the encoding and subsequent decoding of the input stream.

Particular embodiments of the subject matter described in this disclosure can be implemented so as to realize one or more of the following advantages. The described system uses the probability distribution of symbols appearing an input stream to increase data compression when encoding and decoding the stream without decreasing processing throughput or increasing system complexity. In some embodiments, the probability distribution does not need to be fixed and can change dynamically (e.g., the probability of a "u" is very high after a "q" in English, which handled is easily with described system). One way of thinking of this is that the described system employs an assumed probability distribution that can be described as a function of all the symbols up to the current point.

The present disclosure provides methods for entropy coding that include, in some embodiments, receiving an input stream comprising a plurality of symbols having a known entropy characteristic according to a probability distribution of each of the plurality of symbols appearing in the input stream. The methods also include determining an input and respective state for each symbol read from the input stream according to a current content of an encoded output stream and a mapping of each of the plurality of symbols to at least one input and respective state. A number of inputs and respective state are mapped to each of the plurality of symbols is determined based on the probability distribution. Each state is determined based on an entropy characteristic of the input stream. The methods further include appending, for each symbol read from the input stream, the determined input to the encoded output stream based on the respective state and the current content of the encoded output stream. The methods also include transmitting the output stream to a decoding module for processing.

The present disclosure also provides methods for entropy coding comprising that include, in some embodiments, receiving an encoded input stream comprising an encoding of a plurality of symbols having a known entropy characteristic according to a probability distribution of each of the symbols appearing in the input stream. The methods also include processing the input stream by reading a fixed number of bits from the input stream as a read input until the input stream is empty. The methods further include, for each read input: determining a symbol from the plurality of symbols and a respective state according to a current content of an output stream and a mapping of each of the plurality of symbols to at least one input and respective state; persisting the respective state to the input stream; and appending the determined symbol to the output stream. A number of inputs and respective state are mapped to each of the plurality of symbols and determined based on the probability distribution. Each state is determined based on an entropy characteristic of the input stream.

The present disclosure also provides entropy coding systems comprising that include, in some embodiments, an encoding apparatus and a decoding apparatus. The encoding apparatus configured to receive an original input stream comprising a plurality of symbols having a known entropy characteristic according to a probability distribution of each of the symbols appearing in the original input stream. The encoding apparatus is also configured to determine an input and respective state for each symbol read from the original input stream according to a current content of an encoded output stream and a mapping of each of the plurality of symbols to at least one input and respective state. A number of inputs and respective state mapped to each of the plurality of symbols is determined based on the probability distribution. Each state is determined based on based on an entropy characteristic of the original input stream. The encoding apparatus is further configured to append, for each symbol read from the original input stream, the determined input to the encoded output stream based on the respective state and the current content of the encoded output stream. The encoding apparatus is also configured to transmitting the encoded output stream to the decoding apparatus. The decoding apparatus configured to receive, from the encoding apparatus, the encoded output stream as an encoded input stream. The decoding apparatus is also configured to process the encoded input stream by reading a fixed number of bits from the encoded input stream as a read input until the encoded output stream is empty. The decoding apparatus is further configured to for each read input: determine an output symbol from the plurality of symbols and a respective output state according to a current content of a results output stream and the mapping; persist the respective output state to the encoded output stream; and append the determined output symbol to the results output stream.

It is appreciated that methods in accordance with the present disclosure can include any combination of the aspects and features described herein. That is, methods in accordance with the present disclosure are not limited to the combinations of aspects and features specifically described herein, but also may include any combination of the aspects and features provided.

The details of one or more embodiments of the present disclosure are set forth in the accompanying drawings and the description below. Other features and advantages of the present disclosure will be apparent from the description and drawings, and from the claims.

BRIEF DESCRIPTION OF DRAWINGS

The present disclosure is illustrated by way of example, and not by way of limitation, in the figures of the accompanying drawings and in which reference numerals refer to similar element and in which:

FIGS. 5A and 5B each depict an example mapping table generated according to an implementation of the present disclosure;

FIGS. 6A-6C each depict an example table showing the intermediate steps for constructing a mapping between a set of symbols and unique inputs, according to an implementation of the present disclosure.

DETAILED DESCRIPTION

Before any embodiments of the disclosure are explained in detail, it is to be understood that the disclosure is not limited in its application to the details of embodiment and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting, and coupling. Further, "connected" and "coupled" are not restricted to physical or mechanical connections or couplings, and can include electrical or hydraulic connections or couplings, whether direct or indirect.

Definitions

Unless otherwise defined, all technical terms used herein have the same meaning as commonly understood by one of ordinary skill in the art to which the present subject matter belongs. As used in this specification and the appended claims, the singular forms "a," "an," and "the" include plural references unless the context clearly dictates otherwise. Any reference to "or" herein is intended to encompass "and/or" unless otherwise stated.

As used herein, the term "real-time" refers to transmitting or processing data without intentional delay given the processing limitations of a system, the time required to accurately obtain data and images, and the rate of change of the data and images. In some examples, "real-time" is used to describe the presentation of information obtained from components of embodiments of the present disclosure.

As used herein, the term "symbol" refers to a member of a (finite) set referred to as the "alphabet." The probability distribution provides a probability for each symbol in the alphabet. It is helpful to use alphanumeric characters as an example for exposition, but in most cases, the alphabet is something more abstract. For example, in a DD+ variant with five symbols in the alphabet ((−2), (−1), (0), (+1) and (+2)), each symbol has some distinct semantic meaning for the decoder.

Encoding and Decoding System

Figure 1:
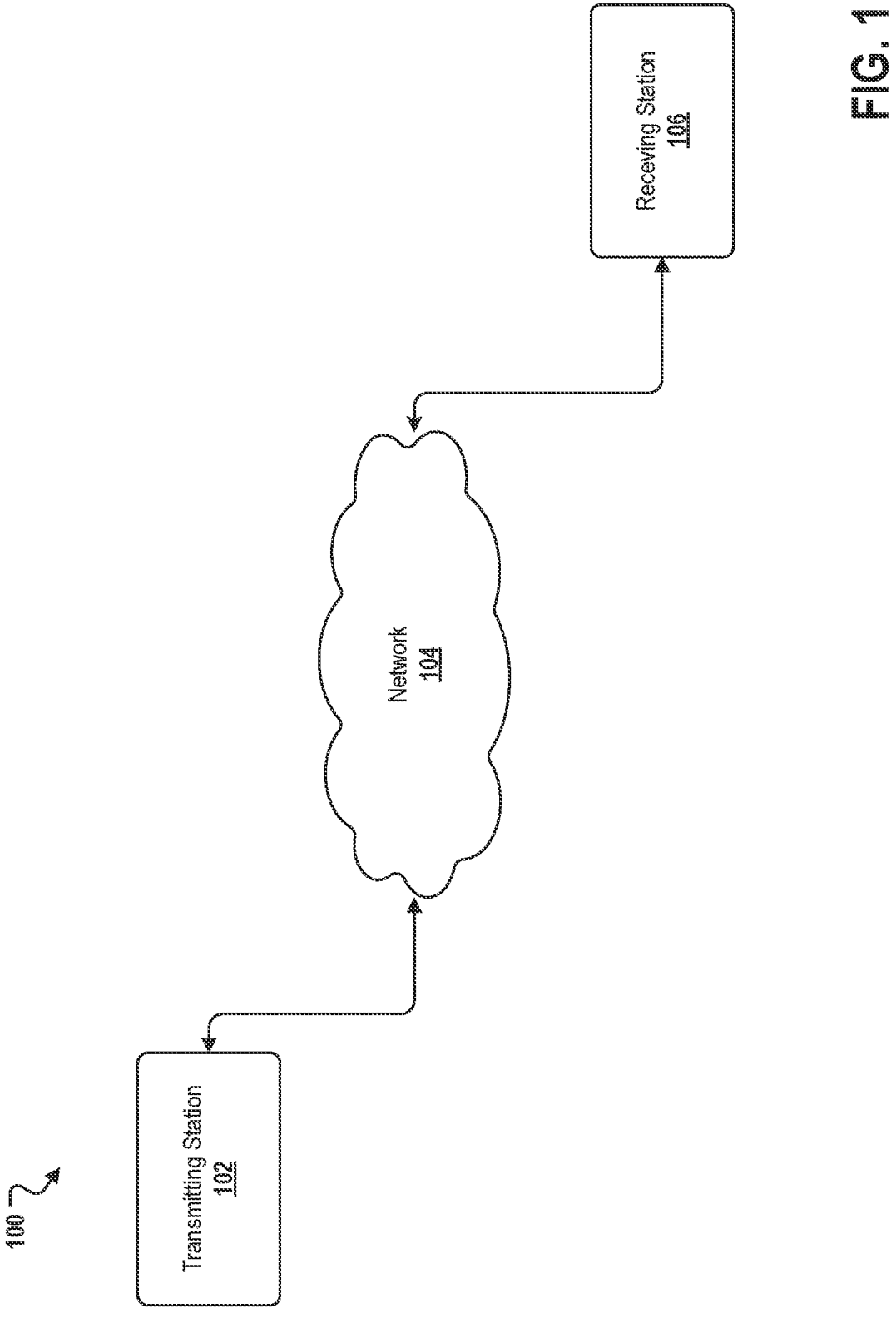
FIG. 1 depicts a schematic of an example encoding and decoding system, according to an implementation of the present disclosure.

Further details of techniques for entropy coding in data compression are described herein. FIG. 1 depicts a schematic of an example encoding and decoding system 100, which can be employed to implement the described improved entropy coding system. As depicted, the encoding and decoding system 100 includes a transmitting station 102 and a receiving station 106 communicating via a network 104.

Figure 2:
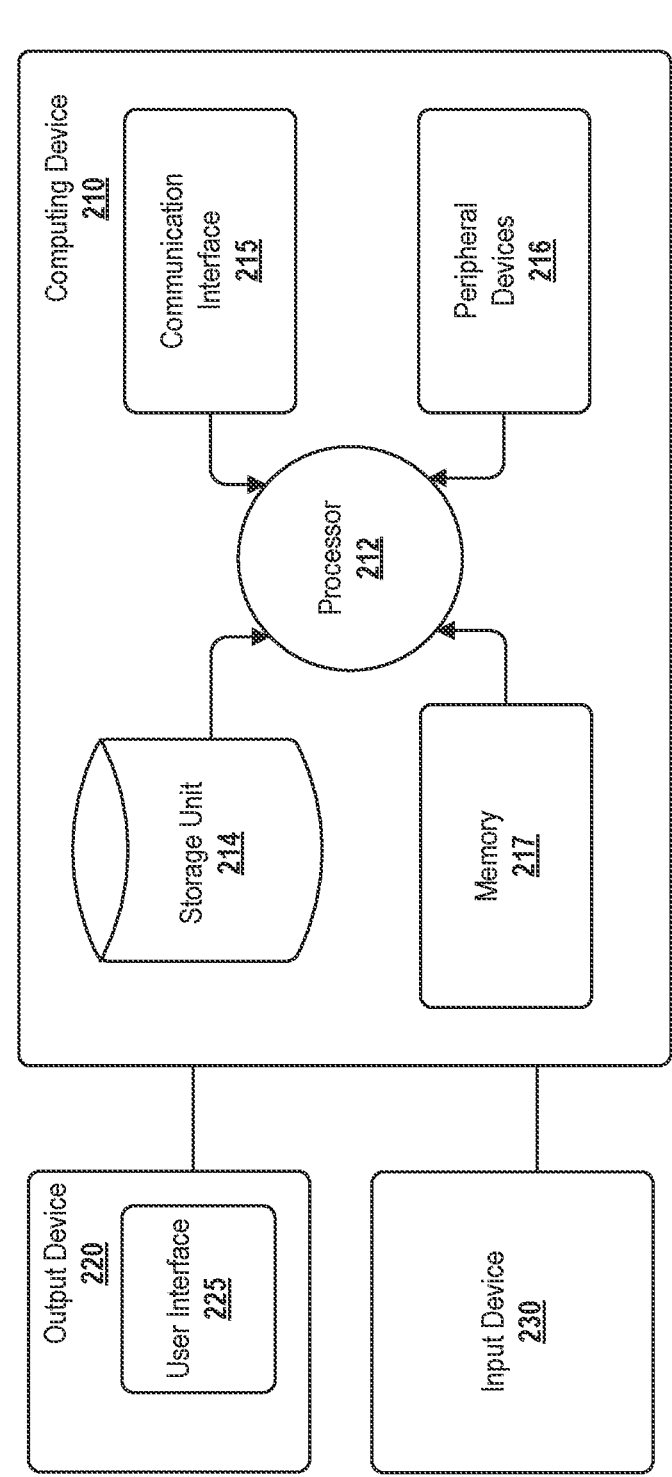
FIG. 2 depicts a block diagram of an example system that includes a computing device that can be programmed or otherwise configured to implement systems or methods of the present disclosure.
Figure 2:

In some embodiments, the transmitting station 102 and receiving station 106 are computing devices having an internal configuration of hardware such as that described in FIG. 2. However, other embodiments of the transmitting station 102 and receiving station 106 are possible. For example, the processing of the transmitting station 102 or the receiving station 106 can be distributed among multiple devices or via virtual processing.

In some embodiments, the network 104 includes the Internet, a local area network (LAN), a wide area network (WAN), a virtual private network (VPN), cellular telephone network, or any other means of transferring the input from the transmitting station 102 to, in the depict example, the receiving station 106.

In some embodiments, the transmitting station 102 and a receiving station 106 communicate via the network 104 for encoding and decoding of, for example, a bitstream. In some embodiments, the transmitting station 102 employs the described improved entropy coding system to encode a bitstream and transmits the encoded stream to the receiving station 106 via the network 104. The receiving station 106 then decodes the received encode bitstream via the described improved entropy coding system.

Other embodiments of the encoding and decoding system 100 are possible. For example, some embodiments omit the network 104. In some embodiments, a bitstream is encoded and stored for transmission, at a later time, to the receiving station 106 or any other device having memory. In some embodiments, the receiving station 106 receives (e.g., via the network 104, a computer bus, or some communication pathway) the encoded bitstream and stores the stream for later decoding. For example, a real-time transport protocol (RTP) or a Hypertext Transfer Protocol-based (HTTP-based) video streaming protocol can be employed for transmission of the encoded stream over the network 104.

In some embodiments, the transmitting station 102 or the receiving station 106 may both encode and decode a bitstream as described below. For example, the receiving station 106 may receive an encoded bitstream from a video conference server (e.g., the transmitting station 102) to decode and provide to a display. The receiving station 106 may then encode and transmit a video bitstream received from, for example, a camera device to the video conference server for decoding and viewing by other participants. In some embodiments, the encoding and decoding system 100 processes image data that may include, for example, a block of data from an image. In such embodiments, the transmitting station 102 encodes the image data and the receiving station 106 decode the image data.

Alternatively, in some embodiments, the receiving station 106 stores an encoded bitstream for later use, such as after receiving the encoded bitstream from the transmitting station 102. In other embodiments, the transmitting station 102 decodes an encoded bitstream prior to transmitting the decoded bitstream to the receiving station 106 for, for example, display.

Computing Devices and Processors

In some embodiments, the platforms, systems, media, and methods described herein include a computing device, such as the transmitting station 102 and the receiving station 106 depicted in FIG. 2 or use of the same. In further embodiments, the computing device includes one or more hardware central processing units (CPUs) or general-purpose graphics processing units (GPGPUs) that carry out device functions. In still further embodiments, the computing device includes an operating system configured to perform executable instructions. In some embodiments, the computing device is optionally communicably connected to a computer network, such as network 104. In further embodiments, the computing device is optionally communicably connected to the Internet such that it can accesses the World Wide Web. In still further embodiments, the computing device is optionally communicably connected to a cloud computing infrastructure. In other embodiments, the computing device is optionally communicably connected to an intranet. In other embodiments, the computing device is optionally communicably connected to a data storage device.

In accordance with the description herein, suitable computing devices include, by way of non-limiting examples, server computers, desktop computers, laptop computers, notebook computers, sub-notebook computers, netbook computers, netpad computers, handheld computers, Internet appliances, mobile smartphones, tablet computers, as well as vehicles, select televisions, video players, and digital music players with optional computer network connectivity. Suitable tablet computers include those with booklet, slate, and convertible configurations.

In some embodiments, the computing device includes an operating system configured to perform executable instructions. The operating system is, for example, software, including programs and data that manages the device's hardware and provides services for execution of applications. Suitable server operating systems include both open source and commercially available products. In some embodiments, the operating system is provided by cloud computing.

Accordingly, computing devices are provided herein that can be used to implement systems or methods of the disclosure. FIG. 2 depicts an example system 200 that includes a computer or computing device 210 that can be programmed or otherwise configured to implement systems or methods of the present disclosure. For example, the computing device 210 can be programmed or otherwise configured to encode or decode a bitstream by employing the described improved entropy coding system as, for example, the transmitting station 102 or the receiving station 106 depicted in FIG. 1.

In the depicted embodiment, the computer or computing device 210 includes an electronic processor (also "processor" and "computer processor" herein) 212, which is optionally a single core, a multi core processor, or a plurality of processors for parallel processing. The depicted embodiment also includes memory 217 (e.g., random-access memory, read-only memory, flash memory), electronic storage unit 214 (e.g., hard disk or flash), communication interface 215 (e.g., a network adapter or modem) for communicating with one or more other systems, and peripheral devices 216, such as cache, other memory, data storage, microphones, speakers, and the like. In some embodiments, the memory 217, storage unit 214, communication interface 215 and peripheral devices 216 are in communication with the electronic processor 212 through a communication bus (shown as solid lines), such as a motherboard. In some embodiments, the bus of the computing device 210 includes multiple buses. In some embodiments, the computing device 210 includes more or fewer components than those illustrated in FIG. 2 and performs functions other than those described herein.

In some embodiments, the memory 217 and storage unit 214 include one or more physical apparatuses used to store data or programs on a temporary or permanent basis. In some embodiments, the memory 217 is volatile memory and requires power to maintain stored information. In some embodiments, the memory 217 includes, by way of non-limiting examples, flash memory, dynamic random-access memory (DRAM), ferroelectric random access memory (FRAM), or phase-change random access memory (PRAM).

In some embodiments, the storage unit 214 is non-volatile memory and retains stored information when the computer is not powered. In other embodiments, the storage unit 214 includes, by way of non-limiting examples, compact disc read-only memories (CD-ROMs), digital versatile discs (DVDs), flash memory devices, magnetic disk drives, magnetic tapes drives, optical disk drives, and cloud computing-based storage. In further embodiments, memory 217 or storage unit 214 is a combination of devices such as those disclosed herein. In some embodiments, memory 217 or storage unit 214 is distributed across multiple machines such as a network-based memory or memory in multiple machines performing the operations of the computing device 210.

In some embodiments, the storage unit 214 is a data storage unit or data store for storing data. In some embodiments, the storage unit 214 store files, such as drivers, libraries, and saved programs. In some embodiments, the storage unit 214 stores user data (e.g., user preferences and user programs). In some embodiments, the computing device 210 includes one or more additional data storage units that are external, such as located on a remote server that is in communication through an intranet or the internet.

In some embodiments, methods as described herein are implemented by way of machine or computer processor executable code stored on an electronic storage location of the computing device 210, such as, for example, on the memory 217 or the storage unit 214. In some embodiments, the electronic processor 212 is configured to execute the code. In some embodiments, the machine executable or machine-readable code is provided in the form of software. In some examples, during use, the code is executed by the electronic processor 212. In some cases, the code is retrieved from the storage unit 214 and stored on the memory 217 for ready access by the electronic processor 212. In some situations, the storage unit 214 is precluded, and machine-executable instructions are stored on the memory 217. In some embodiments, the code is pre-compiled. In some embodiments, the code is compiled during runtime. The code can be supplied in a programming language that can be selected to enable the code to execute in a pre-compiled or as-compiled fashion. For example, the executable code can include an entropy coding application that performs the techniques described herein.

In some embodiments, the electronic processor 212 can execute a sequence of machine-readable instructions, which can be embodied in a program or software. The instructions may be stored in a memory location, such as the memory 217. The instructions can be directed to the electronic processor 212, which can subsequently program or otherwise configure the electronic processor 212 to implement methods of the present disclosure. Examples of operations performed by the electronic processor 212 can include fetch, decode, execute, and write back. In some embodiments, the electronic processor 212 is a component of a circuit, such as an integrated circuit. One or more other components of the computing device 210 can be optionally included in the circuit. In some embodiments, the circuit is an application specific integrated circuit (ASIC) or a field programmable gate arrays (FPGAs). In some embodiments, the operations of the electronic processor 212 can be distributed across multiple machines (where individual machines can have one or more processors) that can be coupled directly or across a network.

In some embodiments, the computing device 210 is optionally operatively coupled to a computer network, such as the network 104 depicted in FIG. 1, via the communication interface 215. In some embodiments, the computing device 210 communicates with one or more remote computer systems through the network. For example, as depicted in FIG. 1, the computing device 210 can communicate with a remote computer system via the network. Examples of remote computer systems include personal computers (e.g., portable PC), slate or tablet PCs, smartphones, or personal digital assistants. In some embodiments, a user can access the computing device 210 via the network. In some embodiments, the computing device 210 is configured as a node within a peer-to-peer network.

In some embodiments, the computing device 210 includes or is in communication with one or more output devices 220. In some embodiments, the output device 220 includes a display to send visual information to a user. In some embodiments, the output device 220 is a liquid crystal display (LCD). In further embodiments, the output device 220 is a thin film transistor liquid crystal display (TFT-LCD). In some embodiments, the output device 220 is an organic light emitting diode (OLED) display. In various further embodiments, an OLED display is a passive-matrix OLED (PMOLED) or active-matrix OLED (AMOLED) display. In some embodiments, the output device 220 is a plasma display. In other embodiments, the output device 220 is a video projector. In yet other embodiments, the output device 220 is a head-mounted display in communication with the computer, such as a (virtual reality) VR headset. In some embodiments, the output device 220 is a touch sensitive display that combines a display with a touch sensitive element that is operable to sense touch inputs as and functions as both the output device 220 and the input device 230. In still further embodiments, the output device 220 is a combination of devices such as those disclosed herein. In some embodiments, the output device 220 provides a user interface (UI) 225 generated by the computing device 210 (for example, software executed by the computing device 210).

In some embodiments, the computing device 210 includes or is in communication with one or more input devices 230 that are configured to receive information from a user. In some embodiments, the input device 230 is a keyboard. In some embodiments, the input device 230 is a pointing device including, by way of non-limiting examples, a mouse, trackball, track pad, joystick, game controller, or stylus. In some embodiments, as described above, the input device 230 is a touchscreen or a multi-touch screen. In other embodiments, the input device 230 is a microphone to capture voice or other sound input. In other embodiments, the input device 230 is a video camera or video camera. In still further embodiments, the input device is a combination of devices such as those disclosed herein.

In some embodiments, the computing device 210 includes an operating system configured to perform executable instructions. The operating system is, for example, software, including programs and data that manages the device's hardware and provides services for execution of applications.

It should also be noted that a plurality of hardware and software-based devices, as well as a plurality of different structural components may be used to implement the described embodiments. In addition, embodiments may include hardware, software, and electronic components or modules that, for purposes of discussion, may be illustrated and described as if the majority of the components were implemented solely in hardware. In some embodiments, the electronic based aspects of the disclosure may be implemented in software (e.g., stored on non-transitory computer-readable medium) executable by one or more processors, such as the electronic processor 212. As such, it should be noted that a plurality of hardware and software-based devices, as well as a plurality of different structural components may be employed to implement various embodiments. It should also be understood that although certain drawings illustrate hardware and software located within particular devices, these depictions are for illustrative purposes only. In some embodiments, the illustrated components may be combined or divided into separate software, firmware or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links.

Data Encoding

Figure 3A:
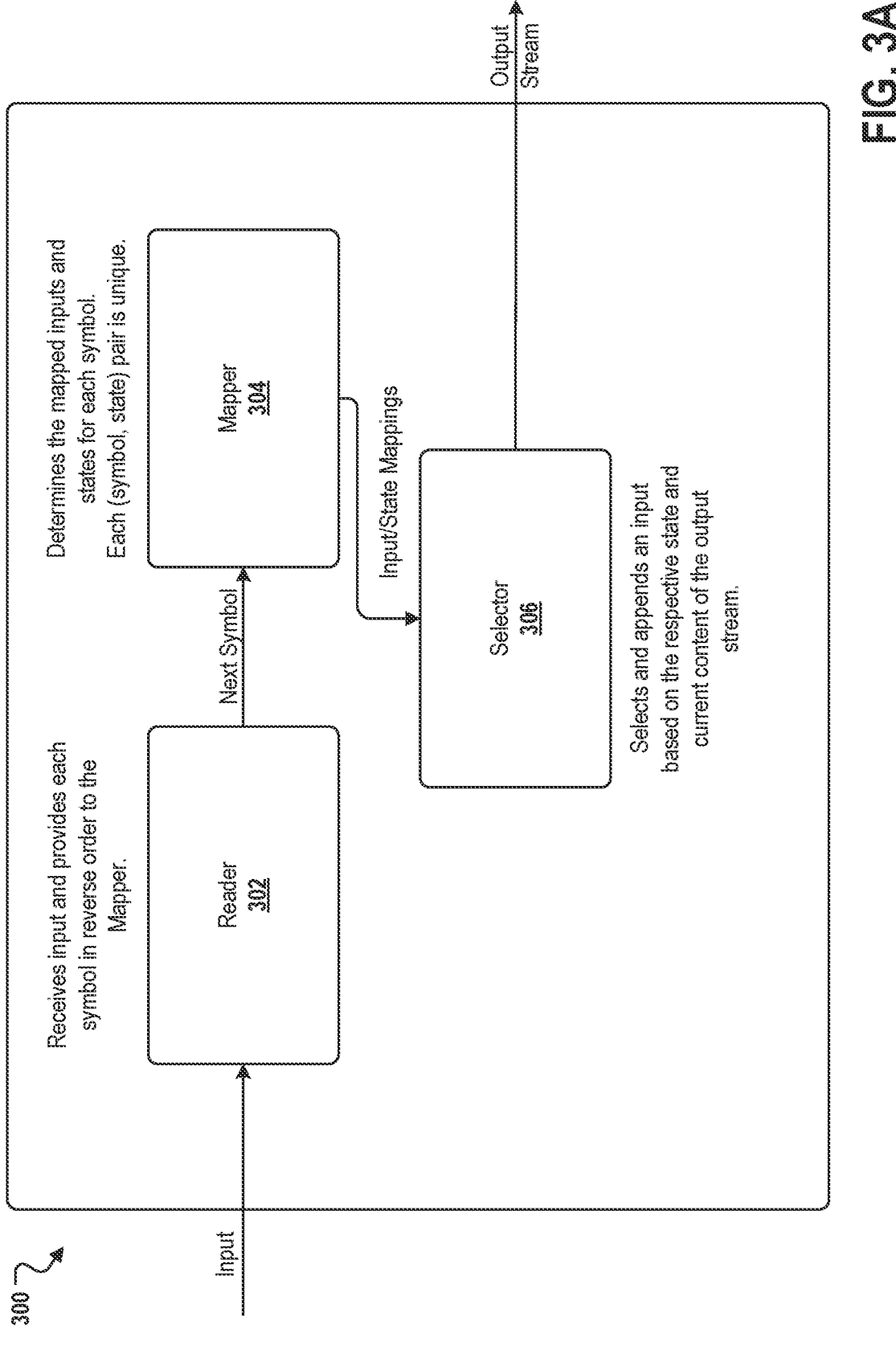
FIG. 3A depicts an example encoder module configured to implement systems or methods of the present disclosure.

FIG. 3A depicts an example encoder module 300 configure to employ the described improved entropy coding system to, for example, encode the contents of a received input stream to an output stream. The example encoder module 300 may be executed, for example, by the transmitting station 102 described in FIG. 1. As depicted, the encoder module 300 includes a reader module 302, a mapper module 304, and a selector module 306. Generally, in some embodiments, the reader module 302 is configured to receive an input and provides each symbol included in the input in reverse order to the mapper module 304, the mapper module 304 is configured to determine the mapped inputs and states for each symbol, and the selector module 306 is configured to select and append an input based on the respective state and content of the output stream. In some embodiments, the inputs and states are each mapped to a symbols or selected from the mapping to compress the size of the output. The encoder module 300 is described in greater detail in the descriptions of FIGS. 3B, 5A, and 5B below.

Figure 3B:
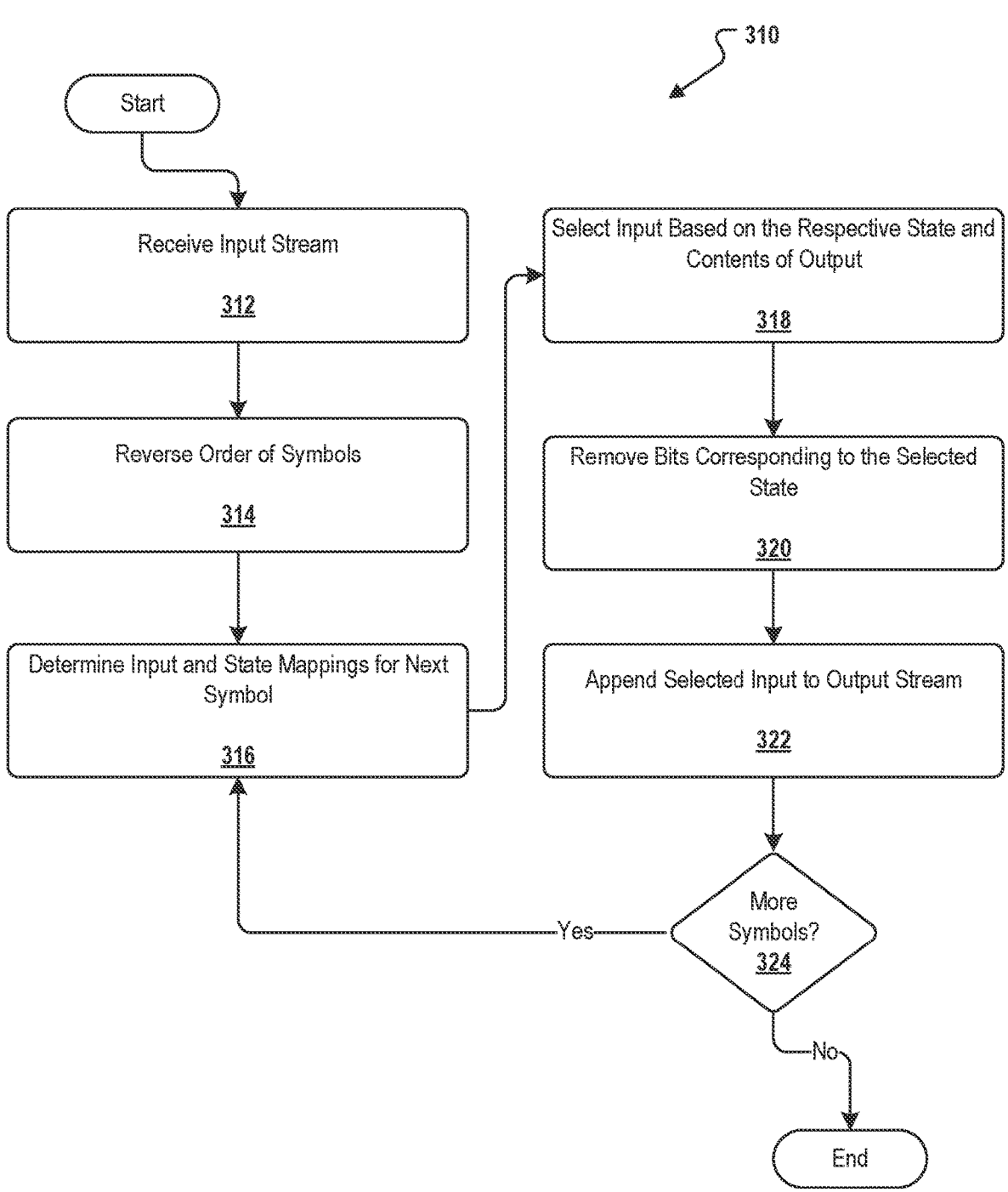
FIG. 3B depicts a flowchart of an example process for encoding a data stream according to an implementation of the present disclosure.

FIG. 3B depicts a flowchart of an example encoding process 310 that can be implemented by embodiments of the present disclosure. The encoding process 310 generally shows in more detail how an input is encoded using the described improved entropy coding system.

For clarity of presentation, the description that follows generally describes the encoding process 310 in the context of FIG. 1-3A. However, it will be understood that the encoding process 310 may be performed, for example, by any other suitable system, environment, software, and hardware, or a combination of systems, environments, software, and hardware as appropriate. In some embodiments, various operations of the encoding process 310 can be run in parallel, in combination, in loops, or in any order.

At 312, the encoder module 300 receives an input, (e.g., an input stream) that is provided to the reader module 302. From 312, the process 310 proceeds to 314.

At 314, the reader module 302 reads the input stream and provides its content (e.g., a string of symbols) to the mapper module 304 in reverse order. For example, in some embodiments, the reader module 302 generates a new stream, appends the content of the input stream in reverse order to the new stream, and provides the new stream to the mapper module 304. From 316, the process 310 proceeds to 316.

At 316, for each symbol, the mapper module determines the possible inputs and respective states according to the described improved entropy coding system. For example, in some embodiments, the mapper module 304, employs a mapping table to determine the possible inputs. In some embodiments, the mapping table is generated for the symbols based on a known entropy characteristic of the symbols according to configured criteria and a probability distribution of each of the symbols appearing in the input stream (see the descriptions of FIGS. 6A-6C below). In some embodiments, each state is determined based on a bijective function. In some embodiments, each state is distinct from each of the other states, is not a prefix of the other states (e.g., a "prefix free" property), is roughly the same length as the other states (so things are either floor(log 2(number of representations)) or ceil(log 2(number of representations)). As an example, each state is determined by adding 1 with wrapping overflow to the last k bits and concatenation a result with a bonus bit and the bonus bit is determined based on two of the mappings having the same symbol and last k bit. From 316, the process 310 proceeds to 318.

At 318, the selector module 306 selects one of the inputs based on the respective state of each input and the content of an output steam. From 318, the process 310 proceeds to 320.

At 320, the selector module 306 removes the bit(s) corresponding to the selected input's respective state. From 320, the process 310 proceeds to 322.

At 322, the selector module 306 appends the input to the output stream. From 322, the process 310 proceeds to decision 324.

At decision 324, when then input contains more symbols, the encoding process 310 proceeds to step 316, and when the input's contents have been processed completely, the encoding process 310 ends. The encoding process 310 is described in greater detail below in the descriptions of examples 502 and 512 depicted in FIGS. 5A and 5B respectively. In some embodiments, Huffman encoding is employed for the last symbol in the received input (e.g., the first symbol that is encoded).

Decoding

Figure 4A:
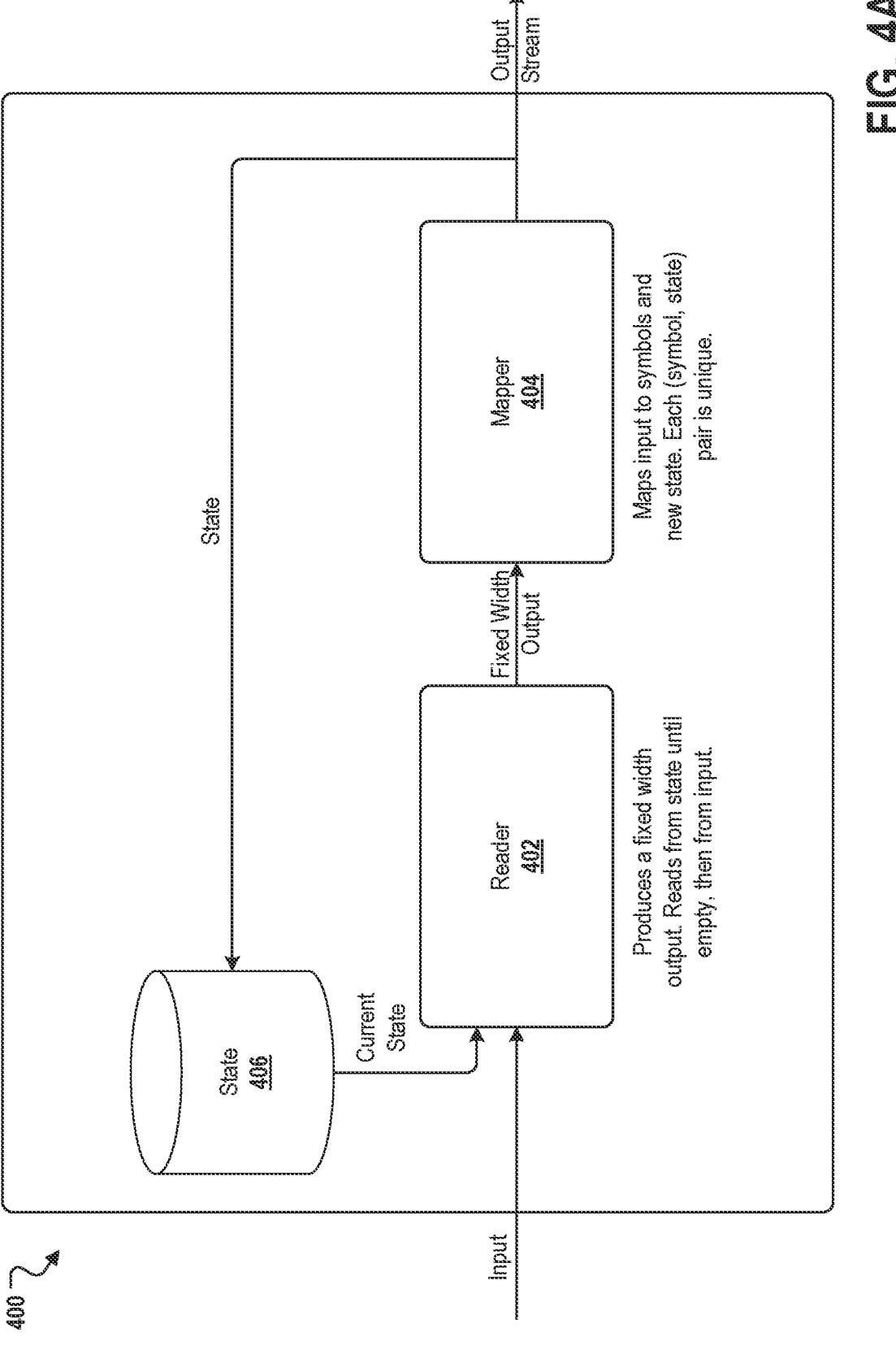
FIG. 4A depicts an example decoder module configured to implement systems or methods of the present disclosure.

FIG. 4A depicts an example decoder module 400 configure to employ the described improved entropy coding system to, for example, decode the contents of a received input stream to an output stream. The example decoder module 400 may be executed, for example, by the receiving station 106 described in FIG. 1. As depicted, the decoder module 400 includes a reader module 402, a mapper module 404, and a state data store 406. Generally, in some embodiments, the reader module 402 is configured to receive the input steam and provide configured fixed width outputs to the mapper module 404 that are determined based on the input stream and a current state stored to the state data store 406; and the mapper module 404 is configured to determine a mapped symbol and state for each fixed width input, persist the state to the state data store 406, and append the symbol to an output stream. In alternative embodiments, the reader module 302 (FIG. 3A) is configured to provide the symbols included in the input in the order received (not reversed) to the mapper module 304 and the reader module 402 is configured to provide the contents of the input steam in reverse order (via the configured fixed width outputs) to the mapper module 404. The decoder module 400 is described in greater detail in the descriptions of FIGS. 4B, 5A, and 5B below.

Figure 4B:
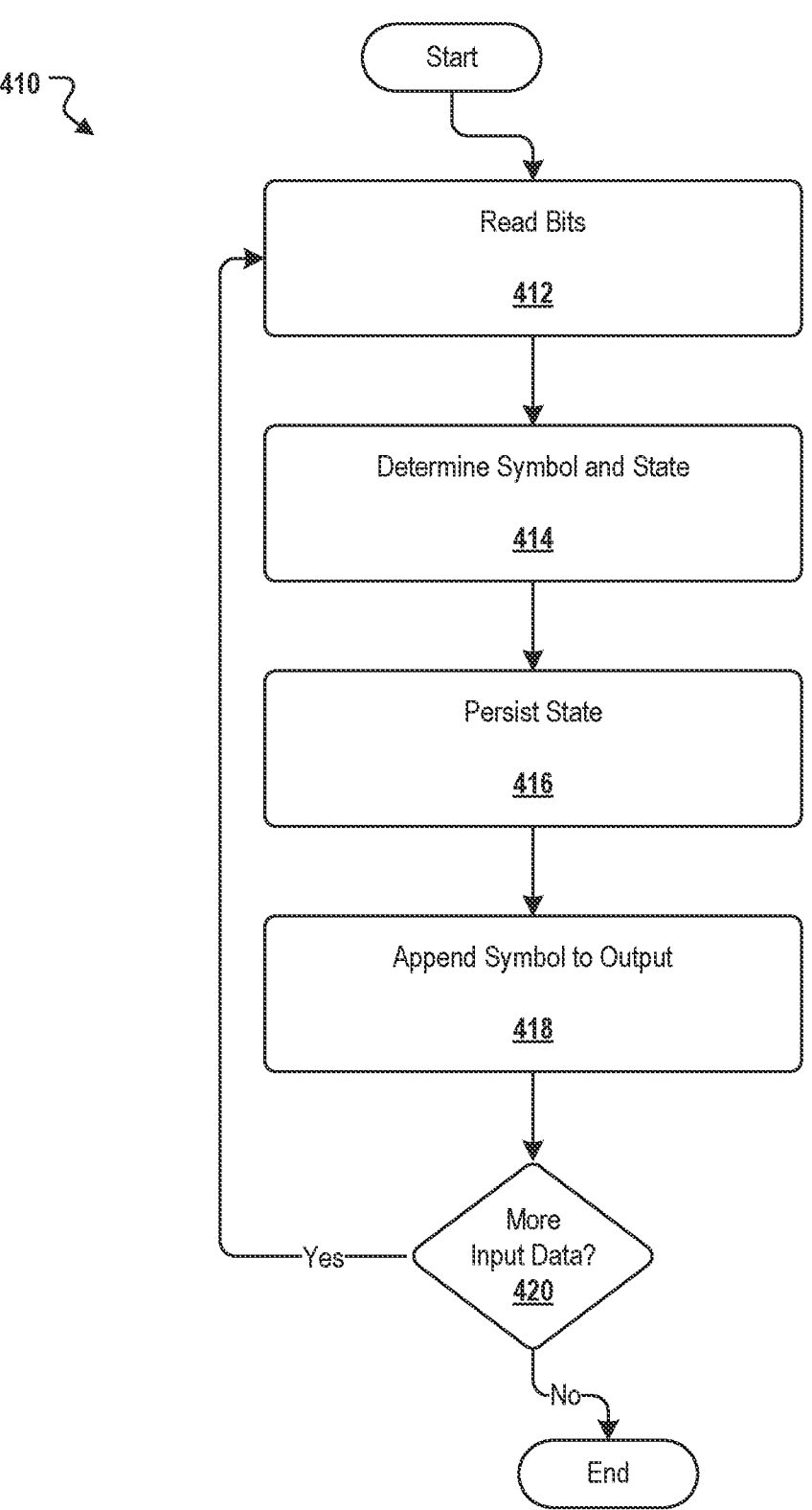
FIG. 4B depicts a flowchart of an example process for decoding a data stream according to an implementation of the present disclosure.

FIG. 4B depicts a flowchart of an example decoding process 410 that can be implemented by embodiments of the present disclosure. The decoding process 410 generally shows in more detail how an input is decoded using the described improved entropy coding system.

For clarity of presentation, the description that follows generally describes the decoding process 410 in the context of FIGS. 1, 2, and 4A. However, it will be understood that the decoding process 410 may be performed, for example, by any other suitable system, environment, software, and hardware, or a combination of systems, environments, software, and hardware as appropriate. In some embodiments, various operations of the decoding process 410 can be run in parallel, in combination, in loops, or in any order.

At 412, after the decoder module 400 receives an input (e.g., an input stream), the reader module 402 reads a fixed width output from the input and the state data store 406 (if in use). For example, when the state data store 406 contains a null state (e.g., when the mapper module 404 is writing the state directly to the input stream or when a symbol has no mapped state), the reader module 402 reads a fixed number of bits (e.g., three bits) from the input stream. As another example, when the state the state data store 406 contains a state with a single bit, the reader module 402 reads the state from the state data store 406 as the first bit of the fix width output and then reads the remaining number of bits (e.g., two bits) from the input. From 412, the process 410 proceeds to 414.

At 414, the mapper module determines a symbol and a respective state based on the fixed width output according to the described improved entropy coding system. For example, in some embodiments, the mapper module 404, employs a mapping table to determine the possible inputs. In some embodiments, the mapping table is generated for the symbols based on a known entropy characteristic of the symbols according to a probability distribution of each of the symbols appearing in the input stream (see the descriptions of FIGS. 6A-6C below). From 414, the process 410 proceeds to 416.

At 416, the mapper module 404 persists the determined state. In some embodiments, the mapper module 404 persists the determined state to the state data store 406. In some embodiments, the mapper module 404 persists the determined state by "pushing" the state to the input stream such that the reader module 402 first reads this state from the input stream in the next read (step 412). From 416, the process 410 proceeds to 418.

At 418, the mapper module 404 appends the symbol to the output stream. From 418, the process 410 proceeds to decision 420.

At decision 420, when then input contains more symbols, the decoding process 410 proceeds to step 412, and when the input's contents have been processed completely, the decoding process 410 ends. The decoding process 410 is described in greater detail below in the descriptions of examples 504 and 514 depicted in FIGS. 5A and 5B respectively. In some embodiments of both the encoding process 310 and the decoding process 410, the probability distribution is employed inline to calculate the symbol and input mapping without the use of a mapping table.

Examples

FIG. 5A depicts an example mapping table 500 generated with an example set of data by employing the described improved entropy coding system. The mapping table 500 includes binary inputs that are each mapped to a symbol from the data set and a state.

FIG. 5A also depicts examples 502 and 504. Example 502 shows an input that is processed, by for example the encoder module 300 executing on the transmitting station 102, according to the encoding process 310 using the mapping table 500. Example 504 shows the resulting output stream from the example 502 processed, by for example the decoder module 400 executing on the receiving station 106, according to the decoding process 410 using the mapping table 500.

In an example embodiment describing the encoding example 502, the encoder module 300 receives (step 312) an input stream with the symbols 'ccd' and is configured to employ the encoding process 310 using the mapping table 500 to encode the input stream to an output stream. The reader module 302 processes the input stream and provides (step 314) the symbols in reverse order to the mapper module 304 beginning with the symbol 'd'. The mapper module 304 determines (step 316), based on the mapping table 500, that the only one input is available: '011', which it provides to the selector module 306. The selector module 306 appends (step 322) the input to the output stream as the mapping table includes a single input mapped to the symbol 'd' (step 318) and the output stream is empty (step 320).

Continuing with the example embodiment describing the encoding example 502, the reader module 302 provides (decision 324) the next symbol 'c' to the mapper module 304. The mapper module 304 determines (316), based on the mapping table 500, that the symbol can be mapped to either the input '010' or '111'. The mapper module 304 provides the possible inputs to the selector module 306. The selector module 306 selects (step 318) which of the inputs to append (step 320) to the output stream according to each of the input's respective state and the output steam's current contents. In this example, the configured criteria are set to shortest number of bits. In the mapping table 500, the state mapped to input '010' is '0' while the state mapped to '111' is '1'. Recall that the last three bits in the output stream are the input '011' (which maps to the 'd' symbol). Thus, the state '0' that is mapped to the input '010' corresponds to the latest bit(s) in the output stream. The selector module 306 removes (320) the bits corresponding to the state '0' from the buffer and appends (step 322) the input '010' to the output stream with a result of '01011' thus reducing the size of the output stream by one bit to meet the configured criteria.

Continuing with example embodiment describing the encoding example 502, the reader module 302 provides (decision 324) the next symbol 'c' (the second one) to the mapper module 304. The mapper module 304 and selector module 306 perform a similar set of operations for this symbol as was described in the preceding paragraph. Again, the selector module 306 selects the '010' input (step 318), bit(s) corresponding to the state '0' are removed (step 320), and the input '010' is appended (step 320) to the output stream. All of the input stream's symbols have been read so the processes ends (decision 324) and the output stream of '0101011' is provided as output of the encoder module 300.

In an example embodiment describing the decoding example 504, the decoder module 400 receives an input stream with binary '0101011' and is configured to employ the decoding process 410 using the mapping table 500 to decode the input stream. The input stream is provided to the reader module 402, which reads a fixed number of bits, based on the mapping table, from first the state data store 406 followed by the input stream if necessary. In the depicted example 502, the reader is configured to read three bits based on the size of the inputs in the mapping table 500. The state data store 406 is empty to begin the decoding process 410 so the reader module 402 reads (step 412) the first three bits from the input stream '010'. The mapper module 404 determines (step 414) the symbol and the state mapped to the fixed width output, which are 'c' and '0' respectively. The mapper module 404 persists (step 416) the state in the state data store 406 and appends (step 418) the symbol to an output stream.

Continuing with the example embodiment describing the decoding example 504, the input stream has additional data so the reader module 402 is prompted (decision 420) to read (step 412) the state, '0', from the state data store 406 and the next two bit from the input stream '10' to fill the configured fixed width output, which is set to '010'. The mapper module 404 determines (step 414) the symbol and the state mapped to the fixed width output, which are again 'c' and '0' respectively. The mapper module 404 persists (step 416) the state in the state data store 406 (e.g., overwriting the previous state) and appends (step 418) the symbol to the output stream, which is now set to 'cc'.

Continuing with the example embodiment describing the decoding example 504, the input stream has additional data so the reader module 402 is again prompted (decision 420) to read (step 412) the state, '0', from the state data store 406 and the next two bit from the input stream '10' to fill the configured fixed width output, which is set to '010'. The mapper module 404 determines (step 414) the symbol and the state mapped to the fixed width output, which 'd' and an empty state respectively. The mapper module 404 persists (step 416) the state in the state data store 406 and appends (step 418) the symbol to the output stream, which is now set to 'ccd'. The input stream has been read fully so the processes ends (decision 420) and the output stream of 'ccd" is provided as output of the decoder module 400.

Generally, the example mapping table 500 and depicted examples 502 and 504 provide a case where an alphabet includes a set of symbols that are equally likely, which guarantees 0 or 1 bits of state for each symbol decoded. This is a trivial case when the number of symbols in the alphabet is a power of two (in which case, in some embodiments, the described improved entropy coding system would produce zero bits of state for every symbol decoded); however, when the number of symbols in the alphabet is larger than a power of two, employing the described improved entropy can save more bits compared to the naïve method.

FIG. 5B depicts another example mapping table 510 generated with an example set of data by employing the describe improved entropy coding system. The mapping table 510 includes binary inputs that are each mapped to a symbol from the data set and a state.

FIG. 5B also depicts examples 512 and 514. Example 512 shows an input 'aabc' that is processed, by for example the encoder module 300 executing on the transmitting station 102, according to the encoding process 310 using the mapping table 510 similar to the description above related to the example 502. Example 514 shows the resulting output stream '000011' from the example 512 processed, by for example the decoder module 400 executing on the receiving station 106, according to the decoding process 410 using the mapping table 510 similar to the description above related to the example 504.

Figure 6B:
Figure 6C:

FIG. 6A-6C depicts example intermediate tables 600, 610, and 620 showing the steps for generating a mapping between each symbol from a set of symbols (e.g., an alphabet) and a unique state, input (e.g., a code) pair based on a probability distribution of each symbol appearing in a data set (e.g., text written in a specific language using the alphabet). The depicted tables 600, 610, and 620 show example steps for generating the mapping table 510 depicted in FIG. 5A; however, the general concepts can be applied to any set of symbols and probability distribution of each symbol.

In some embodiments, when there are N representations for a symbol in given set, the number of bits in the state are either $[\log_2 N]$, equivalently expressed as floor($\log_2 N$), which returns the largest integer not greater than $\log_2 N$, or $[\log_2 N]$, equivalently expressed as ceiling($\log_2 N$), which returns the smallest integer not less than $\log_2 N$. The example table 600 shows the floor case where $k=[\log_2 N]$ with the last k bits taken from each input. The example table 610 shows a bonus bit that is added when two rows in the table have the same symbol and last k bits. In the depicted example, the bit from the input before the k bits is used as the bonus bit. The example table 620 shows forming the states by adding 1 (with wrapping overflow) to the last k bits and concatenation the result with the bonus bit. Adding a 1 to the last k bits ensures that inputs do not directly map to themselves.

Implementation Mechanisms—Hardware Overview

According to one implementation, the techniques described herein are implemented by one or more special-purpose computing devices. The special-purpose computing devices may be hardwired to perform the techniques or may include digital electronic devices such as one or more ASICs or FPGAs that are persistently programmed to perform the techniques or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired or program logic to implement the techniques. The techniques are not limited to any specific combination of hardware circuitry and software, nor to any particular source for the instructions executed by a computing device or data processing system.

Non-transitory Computer Readable Storage Medium

In some embodiments, the platforms, systems, media, and methods disclosed herein include one or more non-transitory computer readable storage media encoded with a program including instructions executable by the operating system of an optionally networked computer. In further embodiments, a computer readable storage medium is a tangible component of a computer. In still further embodiments, a computer readable storage medium is optionally removable from a computer.

The term "storage media" as used herein refers to any media that store data or instructions that cause a machine to operation in a specific fashion. It is non-transitory. Such storage media may comprise non-volatile media or volatile media. Non-volatile media includes, for example, optical or magnetic disks. Volatile media includes dynamic memory. Common forms of storage media include, for example, a floppy disk, a flexible disk, hard disk, solid state memory, magnetic tape drives, magnetic disk drives (or any other magnetic data storage medium), a CD-ROM, DVDs, flash memory devices, optical data storage medium, a random access memory (RAM), programmable ROM (PROM), and erasable programmable ROM (EPROM), a FLASH- EPROM, Non-Volatile RM (NVRAM), or any other memory chip or cartridge. In some cases, the program and instructions are permanently, substantially permanently, semi-permanently, or non-transitorily encoded on the media.

Storage media is distinct from but may be used in conjunction with transmission media. Transmission media participates in transferring information between storage media. For example, transmission media includes coaxial cables, copper wire and fiber optics. Transmission media can also take the form of acoustic or light waves, such as those generated during radio-wave and infrared data communications.

Computer Program

In some embodiments, the platforms, systems, media, and methods disclosed herein include at least one computer program, or use of the same. A computer program includes a sequence of instructions, executable in the computer's CPU, written to perform a specified task. Computer readable instructions may be implemented as program modules, such as functions, objects, API, data structures, and the like, that perform particular tasks or implement particular abstract data types. In light of the disclosure provided herein, those of skill in the art will recognize that a computer program may be written in various versions of various languages.

The functionality of the computer readable instructions may be combined or distributed as desired in various environments. In some embodiments, a computer program comprises one sequence of instructions. In some embodiments, a computer program comprises a plurality of sequences of instructions. In some embodiments, a computer program is provided from one location. In other embodiments, a computer program is provided from a plurality of locations. In various embodiments, a computer program includes one or more software modules. In various embodiments, a computer program includes, in part or in whole, one or more web applications, one or more mobile applications, one or more standalone applications, one or more web browser plug-ins, extensions, add-ins, or add-ons, or combinations thereof.

Data Stores

In some embodiments, the platforms, systems, media, and methods disclosed herein include one or more data stores. In view of the disclosure provided herein, those of skill in the art will recognize that data stores are repositories for persistently storing and managing collections of data. Types of data stores repositories include, for example, databases and simpler store types, or use of the same. Simpler store types include files, emails, and so forth. In some embodiments, a database is a series of bytes that is managed by a DBMS. Many databases are suitable for receiving various types of data, such as weather, maritime, environmental, civil, governmental, or military data. In various embodiments, suitable databases include, by way of non-limiting examples, relational databases, non-relational databases, object-oriented databases, object databases, entity-relationship model databases, associative databases, and extensible markup language (XML) databases. Further non-limiting examples include structured query language (SQL) In some embodiments, a database is internet-based. In some embodiments, a database is web-based. In some embodiments, a database is cloud computing based. In some embodiments, a database is based on one or more local computer storage devices.

EQUIVALENTS, EXTENSIONS, ALTERNATIVES, AND MISCELLANEOUS

In the foregoing specification, possible implementations of the present disclosure have been described with reference to numerous specific details that may vary from implementation to implementation. Any definitions expressly set forth herein for terms contained in the claims shall govern the meaning of such terms as used in the claims. Hence, no limitation, element, property, feature, advantage, or attribute that is not expressly recited in a claim should limit the scope of such claim in any way. The specification and drawings are, accordingly, to be regarded in an illustrative rather than a restrictive sense. It should be further understood, for clarity, that exempli gratia (e.g.) means "for the sake of example" (not exhaustive), which differs from id est (i.e.) or "that is."

Additionally, in the foregoing description, numerous specific details are set forth such as examples of specific components, devices, methods, etc., in order to provide a thorough understanding of implementations of the present disclosure. It will be apparent, however, to one skilled in the art that these specific details need not be employed to practice implementations of the present disclosure. In other instances, well-known materials or methods have not been described in detail in order to avoid unnecessarily obscuring implementations of the present disclosure.

Various aspects of the present disclosure may take any one or more of the following example configurations:

EEE(1) A method for entropy coding comprising receiving an input stream comprising a plurality of symbols having a known entropy characteristic according to a probability distribution of each of the plurality of symbols appearing in the input stream; determining an input and respective state for each symbol read from the input stream according to a current content of an encoded output stream and a mapping of each of the plurality of symbols to at least one input and respective state, wherein a number of inputs and respective state mapped to each of the plurality of symbols is determined based on the probability distribution, and wherein each state is determined based on an entropy characteristic of the input stream; appending, for each symbol read from the input stream, the determined input to the encoded output stream based on the respective state and the current content of the encoded output stream; and transmitting the output stream to a decoding module for processing.

EEE(2) The method for entropy coding apparatus according to EEE(1), wherein each of the determined inputs is appended to the encoded output stream by: removing, from the encoded output stream, bits corresponding to the respective state; and appending the determined input to the encoded output stream.

EEE(3) The method for entropy coding according to any one of EEE(1) or EEE(2), wherein each state is determined based on a bijective function.

EEE(4) The method for entropy coding according to any one of EEE(1) to EEE(3), wherein the decoding module executed by a receiving station, and wherein the encoded output stream is transmitted via a network.

EEE(5) The method for entropy coding according to any one of EEE(1) to EEE(4), wherein k is determined according to the number of possible unique symbols in the input stream.

EEE(6) The method for entropy coding according to any one of EEE(1) to EEE(5), wherein a plurality of mappings is employed to determine the plurality of symbols and selected based on contextual information in the encoded input stream.

EEE(7) The method for entropy coding according to any one of EEE(1) to EEE(6), wherein each of the determined inputs is determined and appended to the encoded output stream in an order reverse of the order of the plurality of symbols are received in the input stream.

EEE(8) The method for entropy coding according to any one of EEE(1) to EEE(7), wherein each input and respective state pair is unique.

EEE(9) The method for entropy coding according to any one of EEE(1) to EEE(8), wherein the probability distribution of each of the plurality of symbols appearing in the input stream is not based on powers of the number two.

EEE(10) A method for entropy coding comprising: receiving an encoded input stream comprising an encoding of a plurality of symbols having a known entropy characteristic according to a probability distribution of each of the symbols appearing in the input stream; processing the input stream by reading a fixed number of bits from the input stream as a read input until the input stream is empty; and for each read input: determining a symbol from the plurality of symbols and a respective state according to a current content of an output stream and a mapping of each of the plurality of symbols to at least one input and respective state, wherein a number of inputs and respective state mapped to each of the plurality of symbols is determined based on the probability distribution, and wherein each state is determined based on an entropy characteristic of the input stream; persisting the respective state to the input stream; and appending the determined symbol to the output stream.

EEE(11) The method for entropy coding according to any one of EEE(10), further comprising for each read input: persisting the respective state to a data store instead of the input stream, wherein each of the fixed number of bits is first read from the data store and then the input stream.

EEE(12) The method for entropy coding according to any one of EEE(10) or EEE(12), wherein each state is determined based on a bijective function.

EEE(13) The method for entropy coding according to any one of EEE(10) to EEE(13), wherein the encoded input stream is received from a transmitting station via a network.

EEE(14) The method for entropy coding according to any one of EEE(10) to EEE(14), wherein the output stream comprises an audio stream, a video stream, genetic data, image compression, object code compression, or network data compression.

EEE(15) The method for entropy coding according to any one of EEE(1) to EEE(7), wherein k is determined according to the number of possible unique symbols in the input stream.

EEE(16) The method for entropy coding according to any one of EEE(10) to EEE(15), wherein a plurality of mappings is employed to determine the plurality of symbols and selected based on contextual information in the encoded input stream.

EEE(17) An entropy coding system comprising: a decoding apparatus; and an encoding apparatus configured to: receive an original input stream comprising a plurality of symbols having a known entropy characteristic according to a probability distribution of each of the symbols appearing in the original input stream; determine an input and respective state for each symbol read from the original input stream according to a current content of an encoded output stream and a mapping of each of the plurality of symbols to at least one input and respective state, wherein a number of inputs and respective state mapped to each of the plurality of symbols is determined based on the probability distribution, and wherein each state is determined based on an entropy characteristic of the original input stream; append, for each symbol read from the original input stream, the determined input to the encoded output stream based on the respective state and the current content of the encoded output stream; and transmitting provide the encoded output stream to the decoding apparatus; the decoding apparatus configured to: receive, from the encoding apparatus, the encoded output stream as an encoded input stream; process the encoded input stream by reading a fixed number of bits from the encoded input stream as a read input until the encoded output stream is empty; and for each read input: determine an output symbol from the plurality of symbols and a respective output state according to a current content of a results output stream and the mapping; persist the respective output state to the encoded output stream; and append the determined output symbol to the results output stream.

EEE(18) The entropy coding system according to EEE(17), wherein the encoding apparatus is a transmitting station, and the decoding apparatus is a receiving station.

EEE(19) The entropy coding system according to any one of EEE(17) or EEE(18), each state is determined based on a bijective function.

EEE(20) The entropy coding system according to any one of EEE(17) to EEE(19), wherein k is determined according to the number of possible unique symbols in the input stream.

The invention claimed is:

1. A method for entropy coding, comprising:
receiving an input stream comprising a plurality of symbols having a known entropy characteristic according to a probability distribution of each of the plurality of symbols appearing in the input stream;
determining a respective set of pairs for a next symbol of the input stream read in a reverse order, wherein each pair includes a respective input and a respective state corresponding to the next symbol in a mapping table configured to map each symbol of an alphabet of symbols to the respective set of pairs, wherein a respective number of pairs in the respective set of pairs is based on the probability distribution;
selecting one pair from the determined respective set of pairs based on a last input appended to an encoded output stream;
removing from the encoded output stream a set of bits matching the respective state of the selected one pair;
appending the respective input of the selected one pair to the encoded output stream; and
transmitting the encoded output stream to a decoding module for processing.

2. The method for entropy coding according to claim 1, further comprising repeating the determining, selecting, removing, and appending steps until all symbols of the input stream are encoded into the encoded output stream.

3. The method for entropy coding according to claim 1, wherein the mapping table represents a bijective function configured to map the alphabet of symbols to a plurality of paired inputs and states; and
wherein each state in the mapping table is distinct from any other state in the mapping table.

4. The method for entropy coding according to claim 1, wherein each state is determined based on last k bits of the respective input, and
wherein k is determined, for each of the plurality of symbols, according to the respective number of pairs.

5. The method for entropy coding according to claim 1, wherein each input and state pair is unique in the mapping table, and/or wherein the probability distribution of each of the plurality of symbols appearing in the input stream is not based on powers of the number two.

6. A non-transitory computer-readable medium storing instructions that, when executed by an electronic processor, cause the electronic processor to perform operations comprising the method according to claim 1.

7. An encoding apparatus configured to perform the method of claim 1.

8. A method for entropy coding, comprising:

receiving an encoded input stream comprising an encoding of a plurality of symbols having a known entropy characteristic according to a probability distribution of each of the symbols appearing in the input stream;

processing the input stream by sequentially reading a fixed number of bits from the encoded input stream or from the encoded input stream and a state data store as a read input until the encoded input stream is empty; and for the read input:

determining a respective symbol and a respective state according to a mapping table configured to map each symbol of an alphabet of symbols to a respective set of pairs, wherein each pair includes a respective input and a respective state, wherein a respective number of pairs in the respective set of pairs is based on the probability distribution;

persisting the determined respective state to the input stream or to the state data store; and appending the determined respective symbol to an output stream.

9. The method for entropy coding according to claim 8, wherein persisting the determined respective state to the input stream comprises pushing the determined respective state to the input stream; and wherein persisting the determined respective state to the data store comprises temporarily storing the determined respective state in the state data store for being read out as a part of the read input, wherein reading the fixed number of bits comprises reading from the data store first and then reading a remaining number of bits from the encoded input stream.

10. The method for entropy coding according to claim 8, wherein the mapping table represents a bijective function configured to map the alphabet of symbols to a plurality of paired inputs and states, and wherein each state in the mapping table is distinct from any other state in the mapping table.

11. The method for entropy coding according to claim 8, wherein each state is determined based on last k bits of the respective input, and wherein k is determined, for each of the plurality of symbols, according to the respective number of pairs.

12. A non-transitory computer-readable medium storing instructions that, when executed by an electronic processor, cause the electronic processor to perform operations comprising the method according to claim 8.

13. A decoding apparatus configured to perform the method of claim 8.

14. The method according to claim 1, wherein the method further comprises, prior to transmitting, determining, for a first symbol of the plurality of symbols, an input and appending the determined input to the encoded output stream.

15. The method according to claim 1, wherein each of the respective inputs in the mapping table has a predetermined fixed length and/or has a prefix-free property.

16. The method according to claim 1, wherein the respective state is a bit sequence uniquely associated with the respective input.

17. The method according to claim 1, wherein at least one of the plurality of symbols is mapped in the mapping table to at least two different pairs.

18. The method according to claim 17, wherein determining the respective set of pairs for the at least one of the plurality of symbols comprises selecting the at least two different pairs in the mapping table.

* * * * *